US009491895B2

(12) United States Patent
Steeves et al.

(10) Patent No.: US 9,491,895 B2
(45) Date of Patent: Nov. 8, 2016

(54) POWER DISTRIBUTION RACK BUS BAR ASSEMBLY AND METHOD OF ASSEMBLING THE SAME

(71) Applicant: General Electric Company, Schenectady, NY (US)

(72) Inventors: Michael Clyde Steeves, Garland, TX (US); Khanh Quoc Nguyen, Lucas, TX (US); Paul Scott Nessman, Mesquite, TX (US); Raghothama Reddy, Murphy, TX (US)

(73) Assignee: General Electric Company, Schenectady, NY (US)

( * ) Notice: Subject to any disclaimer, the term of this patent is extended or adjusted under 35 U.S.C. 154(b) by 128 days.

(21) Appl. No.: 14/102,126

(22) Filed: Dec. 10, 2013

(65) Prior Publication Data

US 2014/0247540 A1 Sep. 4, 2014

Related U.S. Application Data (60) Provisional application No. 61/771,936, filed on Mar. 3, 2013.

(51) Int. Cl.
*H02G 5/00* (2006.01)
*H02B 1/20* (2006.01)
*H02B 1/26* (2006.01)
*H01R 4/60* (2006.01)
*H05K 13/04* (2006.01)
*H05K 7/14* (2006.01)

(52) U.S. Cl.
CPC ............ *H05K 13/04* (2013.01); *H05K 7/1432* (2013.01); *Y10T 29/49117* (2015.01)

(58) Field of Classification Search
CPC ........ H01B 17/14; H01B 17/18; H02B 1/20; H02B 1/21; H02B 1/22; H02B 1/04; H05K 7/1457

USPC .................. 361/624, 638, 775; 439/212, 213
See application file for complete search history.

(56) References Cited

U.S. PATENT DOCUMENTS

| | | | | |
|---|---|---|---|---|
| 3,482,143 A | * | 12/1969 | Bugni | H02B 1/21 361/608 |
| 4,157,582 A | * | 6/1979 | Myers | H02B 1/056 361/636 |
| 4,360,857 A | * | 11/1982 | Olashaw | H02B 1/21 174/71 B |
| 5,011,421 A | * | 4/1991 | Duke | H02G 5/06 174/71 B |
| 5,394,296 A | * | 2/1995 | Erickson, Jr. | H02G 5/08 361/614 |
| 5,672,070 A | * | 9/1997 | Weiss | H02M 7/003 439/213 |
| 6,310,783 B1 | | 10/2001 | Winch et al. | |

(Continued)

*Primary Examiner* — Chau N Nguyen
*Assistant Examiner* — Roshn Varghese
(74) *Attorney, Agent, or Firm* — General Electric Company (57) ABSTRACT

A power distribution rack includes a chassis that defines a first slot and a second slot adjacent the first slot. The power distribution rack also includes a plurality of electronics modules including a first module coupled within the first slot and a second module coupled within the second slot. A central bus bar assembly is coupled to the chassis and includes an outer bus bar including a first flange, a second flange, and a first bus plate extending therebetween. The first and second flanges and the first bus plate define a first channel. The bus bar assembly further includes an inner bus bar coupled within the first channel. The inner bus bar includes a third flange, a fourth flange, and a second bus plate extending therebetween. The first and third flanges are coupled to the first module and the second and fourth flanges are coupled to the second module.

19 Claims, 6 Drawing Sheets

(56) References Cited

U.S. PATENT DOCUMENTS

| | | | | |
|---|---|---|---|---|
| 6,392,141 | B1 * | 5/2002 | Smith | H02B 1/202 174/497 |
| 6,762,362 | B1 * | 7/2004 | Cavanaugh | H05K 7/1457 174/149 B |
| 6,921,862 | B2 * | 7/2005 | Bach | H02B 1/21 174/149 B |
| 6,967,283 | B2 | 11/2005 | Rasmussen et al. | |
| 7,286,337 | B2 * | 10/2007 | Masuhara | H02B 11/167 361/603 |
| 7,358,439 | B2 | 4/2008 | Rasmussen et al. | |
| 7,365,964 | B2 | 4/2008 | Donahue, IV | |
| 7,542,268 | B2 | 6/2009 | Johnson et al. | |
| 7,675,740 | B2 | 3/2010 | Rasmussen et al. | |
| 7,718,889 | B2 | 5/2010 | Rasmussen et al. | |
| 8,107,225 | B2 | 1/2012 | Rasmussen et al. | |
| 8,173,898 | B2 | 5/2012 | Rasmussen et al. | |
| 8,570,714 | B2 | 10/2013 | Weighell et al. | |
| 8,837,116 | B2 * | 9/2014 | Eichler | H05K 7/1432 361/605 |
| 2002/0167828 | A1 * | 11/2002 | Parkhill | H01L 25/072 361/746 |
| 2007/0258219 | A1 * | 11/2007 | Howes | H05K 7/1432 361/728 |
| 2010/0008018 | A1 * | 1/2010 | Korich | H01G 2/04 361/306.1 |
| 2012/0306213 | A1 * | 12/2012 | Hubbers | H03K 17/16 361/631 |
| 2013/0003263 | A1 | 1/2013 | Rasmussen et al. | |

* cited by examiner

POWER DISTRIBUTION RACK BUS BAR ASSEMBLY AND METHOD OF ASSEMBLING THE SAME

CROSS REFERENCE TO RELATED APPLICATIONS

This application claims priority to and the benefit of the filing date of U.S. Provisional Application No. 61/771,936 filed on Mar. 3, 2013, which is hereby incorporated by reference in its entirety.

BACKGROUND

The embodiments described herein relate generally to a power distribution rack, and, more specifically, to a central bus bar assembly for a power distribution rack and methods of assembly thereof.

Electrical components or modules are sometimes stored in a stacked relationship not only to allow the modules to be electrically interconnected with one another, but also so they can be readily accessed and used. This is particularly true in power management situations in which a large number of densely packed individual modules are typically mounted together in a rack system to create a desired power management system. Such rack systems may consist of a frame structure including layered shelves that define individual slots into which smaller electronics modules, such as power modules, rectifiers, or controllers can be inserted. Due to each module including an alternating current (AC) connector and a direct current (DC) connector in close proximity to each other and the AC/DC connections of other modules, the AC equipment, such as connectors and cables, must be isolated from the DC equipment to prevent power losses and interference. Further, industry regulations require a minimum amount of spacing between AC and DC cables that often results in multiple layers of expensive insulation per cable to ensure AC/DC isolation while minimizing the effect of electromagnetic interference (EMI) between the AC connections and DC connections.

At least some known power distribution racks isolate the alternating AC and DC connections of adjacent modules by providing a single horizontal bus bar per shelf that is connected to the DC connector of the electronics modules from that shelf. The power from each of the horizontal bus bars is transferred to a single vertical bus bar and channeled out of the rack. However, such a design results in a complex network of wires and cables within a limited amount of space. Additionally, an increased amount of EMI may be generated because connecting the AC connections on each shelf requires crossing over the DC connections, and connecting the DC connections requires crossing over the AC connections. Furthermore, the additional horizontal bus bars increase the cost of production and require multiple mechanical joints that increase both transmission power losses and maintenance costs.

BRIEF DESCRIPTION

In one aspect, a central bus bar assembly for use with a power distribution rack is provided. The bus bar assembly includes an outer bus bar including a first flange, a second flange, and a first bus plate extending therebetween. The first and second flanges and the first bus plate define a first channel. The bus bar assembly further includes an inner bus bar coupled within the first channel. The inner bus bar includes a third flange, a fourth flange, and a second bus plate extending therebetween. The first and third flanges are configured to couple to a first electronics module and the second and fourth flanges are configured to couple to a second electronics module.

In another aspect, a power distribution rack is provided. The power distribution rack includes a chassis that defines a first slot and a second slot that is adjacent the first slot. The power distribution rack also includes a plurality of electronics modules including a first electronics module coupled within the first slot and a second electronics module coupled within the second slot. A central bus bar assembly is coupled to the chassis and includes an outer bus bar including a first flange, a second flange, and a first bus plate extending therebetween. The first and second flanges and the first bus plate define a first channel. The bus bar assembly further includes an inner bus bar coupled within the first channel. The inner bus bar includes a third flange, a fourth flange, and a second bus plate extending therebetween. The first and third flanges are coupled to the first electronics module and the second and fourth flanges are coupled to the second electronics module.

In yet another aspect, a method of assembling a power distribution rack is provided. The method includes providing a chassis that defines a first slot and a second slot adjacent the first slot. A first electronics module is inserted into the first slot and a second electronics module is inserted into the second slot. A bus bar assembly is then coupled to the chassis The bus bar assembly includes an outer bus bar including a first flange, a second flange, and a first channel defined therebetween. The bus bar assembly also includes an inner bus bar coupled within the first channel, wherein the inner bus bar includes a third flange and a fourth flange. The method further includes coupling the first and third flanges to the first electronics module and coupling the second and fourth flanges to the second electronics module.

DETAILED DESCRIPTION

The embodiments include a new power distribution rack that defines a plurality of shelves, each having adjacent left and right slots. The rack includes a plurality of electronics modules that are inserted into the slots and are coupled to a centrally-positioned bus bar assembly. The bus bar assembly includes nested inner and outer bus bars that are coupled directly to AC and DC connectors of the electronics modules to eliminate the need for a backplane and intermediate connectors. Orientation of the electronics modules facilitate positioning the DC connectors on the module in the left slot adjacent DC connectors of the module in the right slot such that the central bus bar assembly is directly coupled to each DC connector. Such a configuration simplifies the cable networking and maximizes usage of the limited allowable space within the power distribution rack to meet industry regulations and provide superior performance, reduced costs and easy use.

Figure 1:
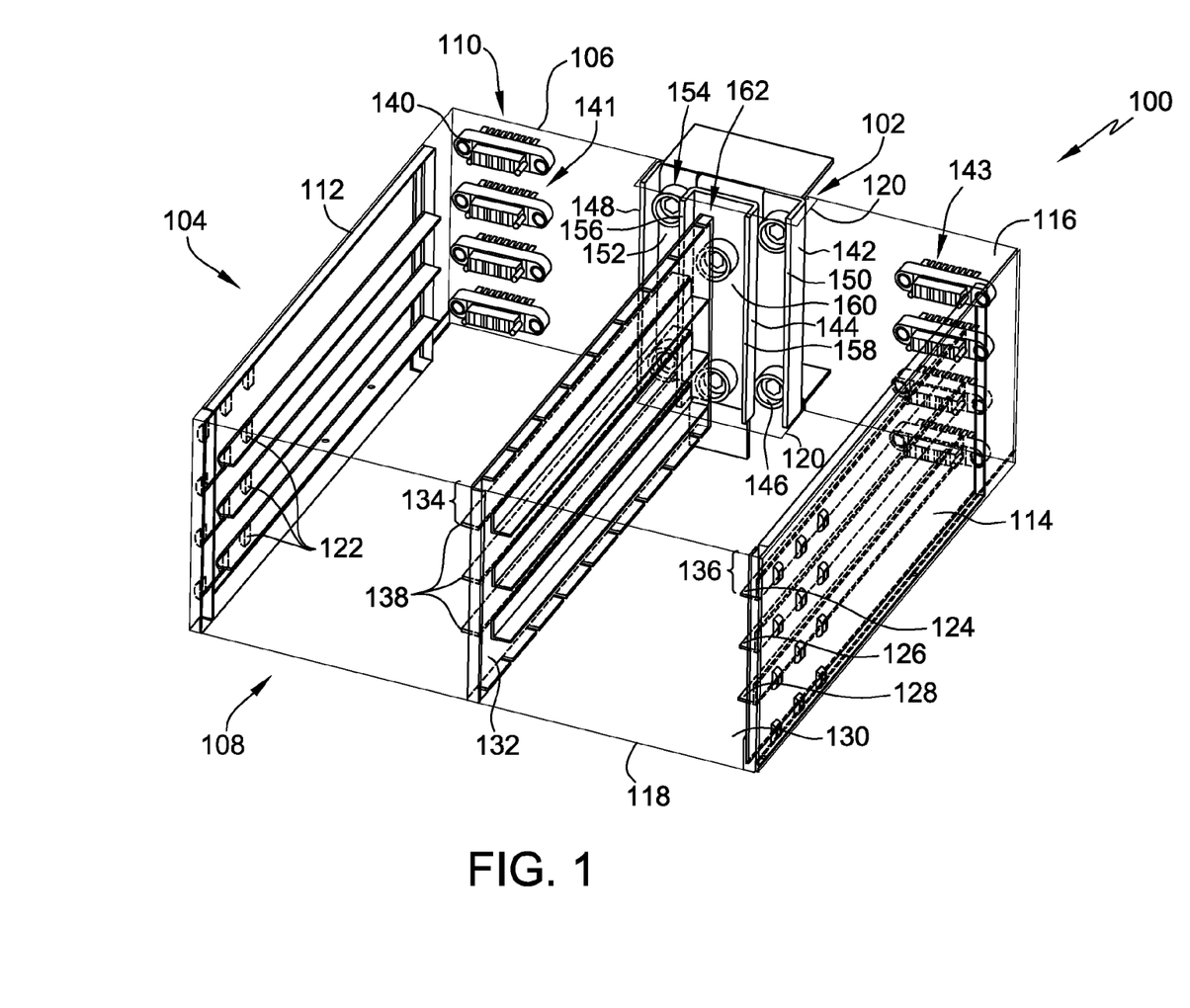
FIG. 1 is a perspective view of an exemplary embodiment of a power distribution rack illustrating a central bus bar assembly mounted thereto.
Figure 2:
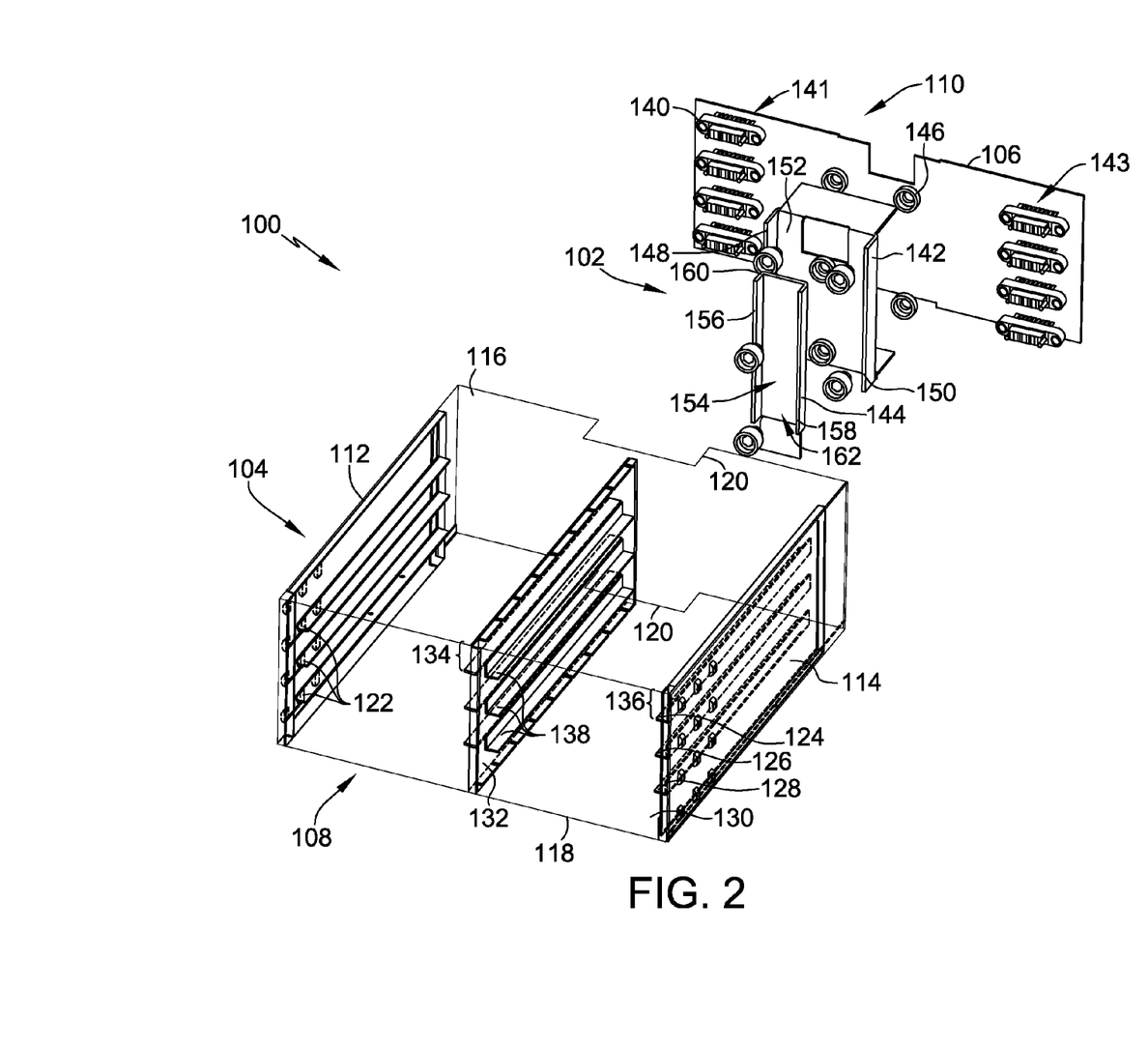
FIG. 2 is an exploded perspective view of the exemplary power distribution rack and central bus bar assembly shown in FIG. 1.

FIG. 1 illustrates a perspective view of a power distribution rack 100 that includes an exemplary central bus bar assembly 102. Rack 100 also includes a chassis 104 and a rack backing 106 that are each coupled to bus bar assembly 102 to form rack 100. FIG. 2 is an exploded perspective view of rack 100 illustrating bus bar assembly 102, chassis 104 and rack backing 106. In the exemplary embodiment, chassis 104 includes a front end 108 and a back end 110. A first side wall 112 and a second side wall 114 each extend between ends 108 and 110. Similarly, chassis 104 includes a top wall 116 and a bottom wall 118 that are each coupled to side walls 112 and 114 and extend between ends 108 and 110. Proximate back end 110, top wall 116 and bottom wall 118 each include a notch 120 that is configured to receive bus bar assembly 102 at a location substantially mid-way between first side wall 112 and second side wall 114. In the exemplary embodiment, chassis 104 also includes a plurality of rail portions 122 coupled to the inner sides of first and second side walls 112 and 114. Rail portions 122 extend between front and back ends 108 and 110 and are evenly spaced along first and second side walls 112 and 114 such that rail portions 122 define a plurality of shelves including a first shelf 124, a second shelf 126, a third shelf 128, and a fourth shelf 130 between top and bottom walls 116 and 118. In the exemplary embodiment, chassis 104 includes four shelves. Alternatively, chassis 104 may include any number of shelves to facilitate operation of rack 100 as described herein.

In the exemplary embodiment, chassis 104 further includes a middle wall 132 that defines a longitudinal axis 133 and that divides each shelf 124, 126, 128, and 130 into a first slot 134 and a second slot 136. First slot 134 is defined between first side wall 112 and middle wall 132 and second slot 136 is defined between middle wall 132 and second side wall 114. Rail portions 122 are coupled to opposing sides of middle wall 132 opposite rail portions 122 on side walls 112 and 114 to facilitate supporting an electronics module (not shown in FIG. 1) that is inserted into adjacent slots 134 and 136 of each shelf 124, 126, 128, and 130. In the exemplary embodiment, rail portions 122 are substantially L-shaped such that each rail 122 includes a flange 138 that extends a predetermined distance from one of walls 112, 114, or 132 substantially parallel to top and bottom walls 116 and 118. Flanges 138 on opposite sides of each slot 134 and 136 facilitate supporting the electronics module after insertion into rack 100. In contrast to at least some known power distribution racks, rack 100 does not include shelf dividers that extend a full distance between opposing sides of the rack and serve simultaneously as a top divider for a lower shelf and a bottom divider for an upper shelf directly above the lower shelf. In the exemplary embodiment, rail flanges 138 extend only a predetermined distance from one of walls 112, 114, or 132 to facilitate supporting the electronics module while also enabling cooling air to flow between shelves 124, 126, 128, and 130.

Rack backing 106 is coupled to both side walls 112 and 114 proximate back end 110 of rack 100. Backing 106 includes a plurality of sets of vertically aligned AC receivers 140 such that each receiver 140 is configured to couple to a corresponding AC connector (not shown in FIG. 1) on a respective electronics module. The plurality of sets of vertically aligned AC receivers 140 includes a first set 141 positioned proximate first side wall 112 and a second set 143 positioned proximate second side wall 114. In the exemplary embodiment, backing 106 replaces a traditional printed wiring board backplane to facilitate a simpler transfer of energy as described in further detail below. Alternatively, rack 100 may include a traditional backplane in addition to or as a replacement for backing 106.

In the exemplary embodiment, bus bar assembly 102 is coupled within notches 120 between rack backing 106 and chassis 104. Bus bar assembly 102 is positioned at back end 110 of rack 100 proximate middle wall 132, and extends between top and bottom walls 116 and 118 such that assembly 102 is oriented vertically parallel to backing 106. In the exemplary embodiment, bus bar assembly 102 includes an outer bus bar 142, an inner bus bar 144, and a plurality of insulator bushings 146 that isolate bus bars 142 and 144 from each other and from chassis 104. In the exemplary embodiment, outer bus bar 142 has a negative polarity and inner bus bar 144 has a positive polarity such that each slot 134 and 136 includes portions of bus bar assembly 102 having opposing polarities. Alternatively, outer bus bar 142 may have a positive polarity and inner bus bar 144 may have a negative polarity. Generally, outer bus bar 142 may have any polarity that is opposite the polarity of inner bus bar 144 to facilitate operation of bus bar assembly 102 as described herein. Outer bus bar 142 includes a first flange 148, a second flange 150, and a bus plate 152 extending therebetween. Outer bus bar 142 is substantially U-shaped such that flanges 148 and 150 and plate 152 define a first channel 154. Similarly, inner bus bar 144 includes a first flange 156, a second flange 158, and a bus plate 160 extending therebetween. Inner bus bar 144 is also substantially U-shaped such that flanges 156 and 158 and plate 160 define a second channel 162. In the exemplary embodiment, inner bus bar 144 is coupled substantially mid-way between flanges 148 and 150 within first channel 154.

In the exemplary embodiment, bus bar assembly 102 is configured to channel DC power between the electronics modules and rack 100. Because DC power is high in amperage, a greater amount of conductor material is required to safely transfer the energy. In the exemplary embodiment, bus bar assembly 102 is fabricated from copper. Alternatively, bus bar assembly 102 may be fabricated from any conducting material that facilitates operation of bus bar assembly 102 as described herein. Bus bar assembly 102 is configured to engage the electronics modules that are inserted into slots 134 and 136 of shelves 124, 126, 128, and 130 to provide a single, vertically-oriented bus bar that serves as a common DC bus bar to eliminate the need for horizontal bus bars in known bus bar assemblies. Directly connecting the electronics modules to bus bar assembly 102 reduces the cost to produce rack 100 because fewer components are required, such as mating connectors between the modules and a backplane, and also because less copper is required to connect the modules to a common bus bar.

Figure 3:
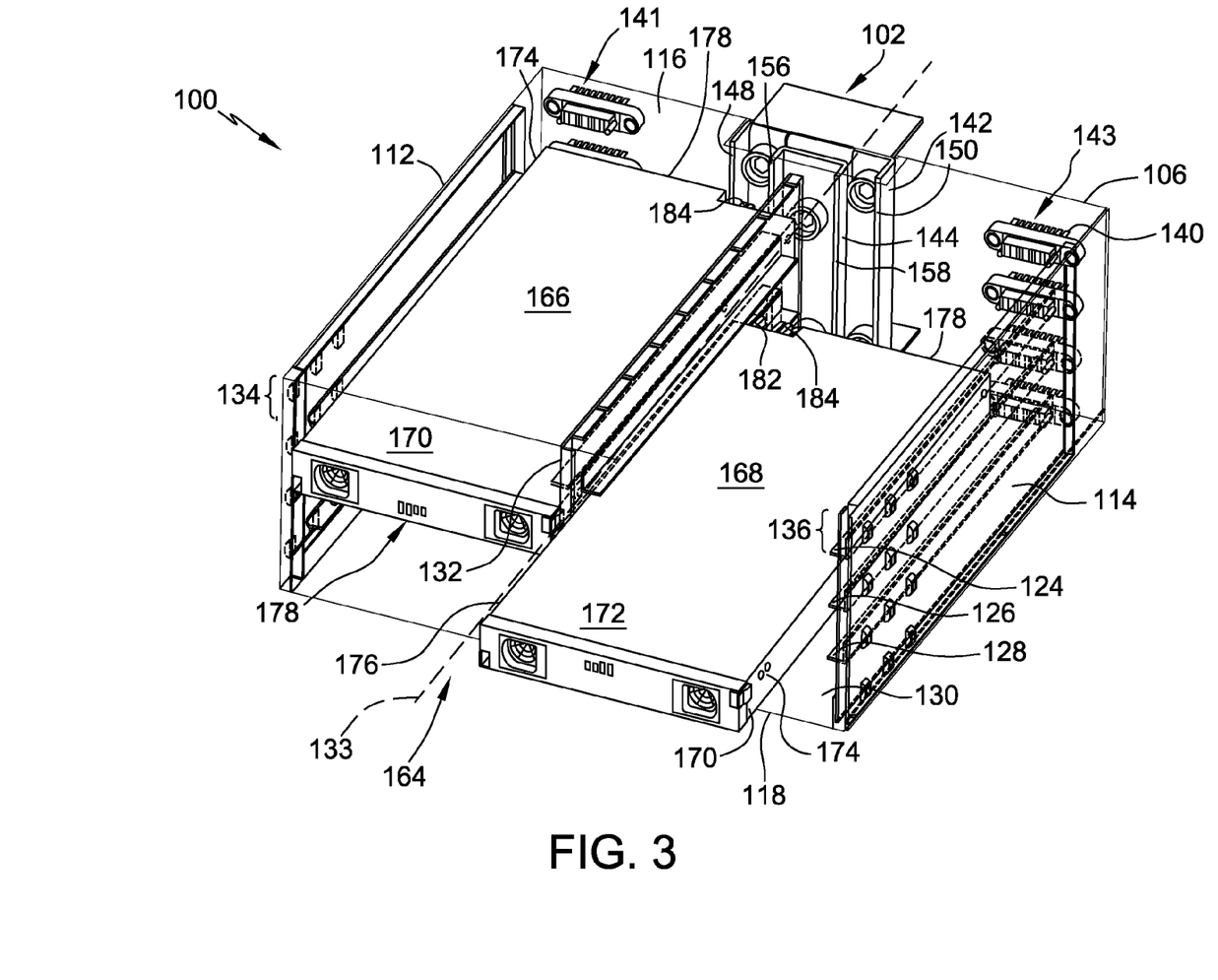
FIG. 3 is a perspective top view of the exemplary power distribution rack partially assembled illustrating the insertion of exemplary adjacent electronics modules therein.
Figure 4:
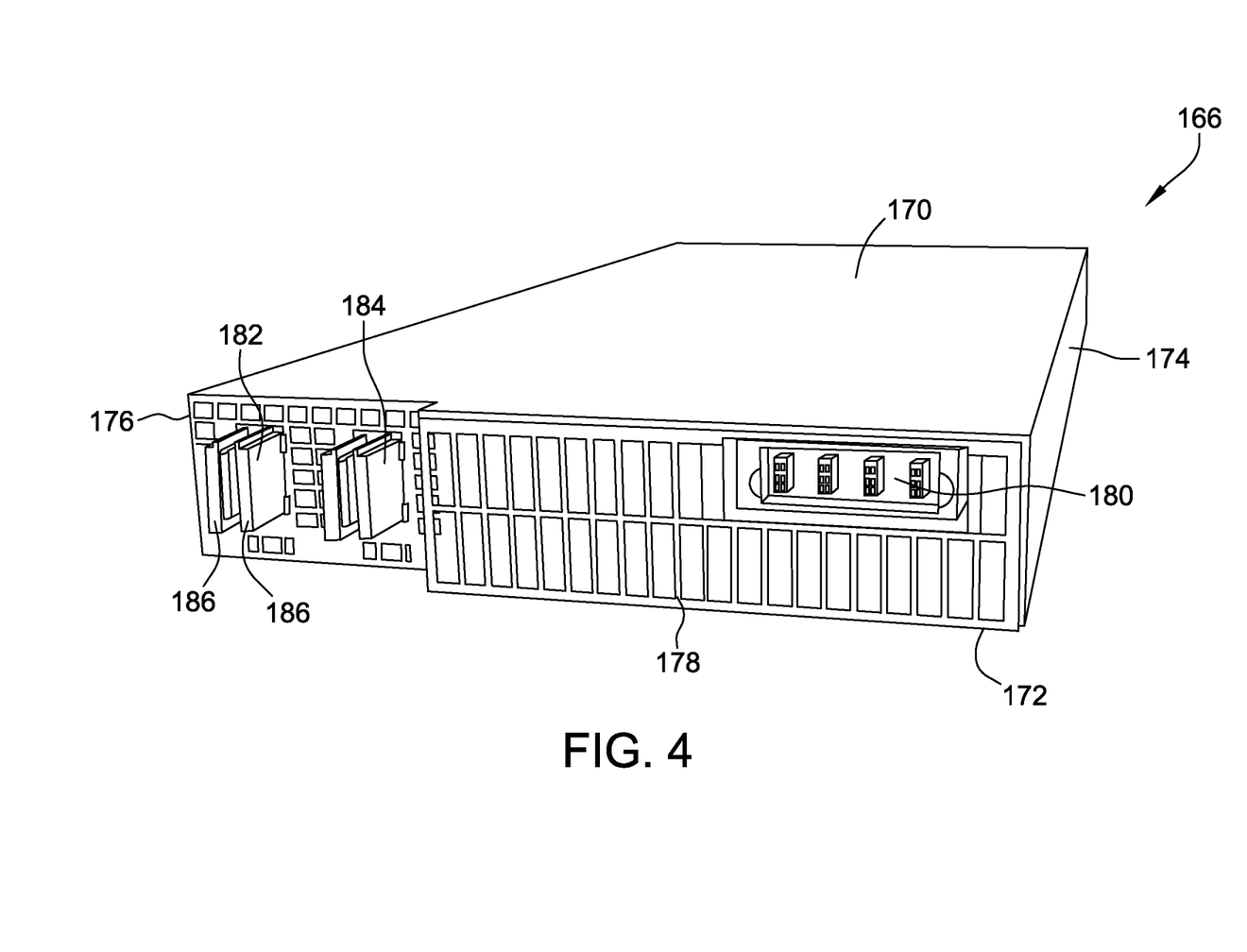
FIG. 4 is a rear perspective view of the exemplary electronics module shown in FIG. 3 that may be used with the power distribution rack shown in FIG. 1.
Figure 5:
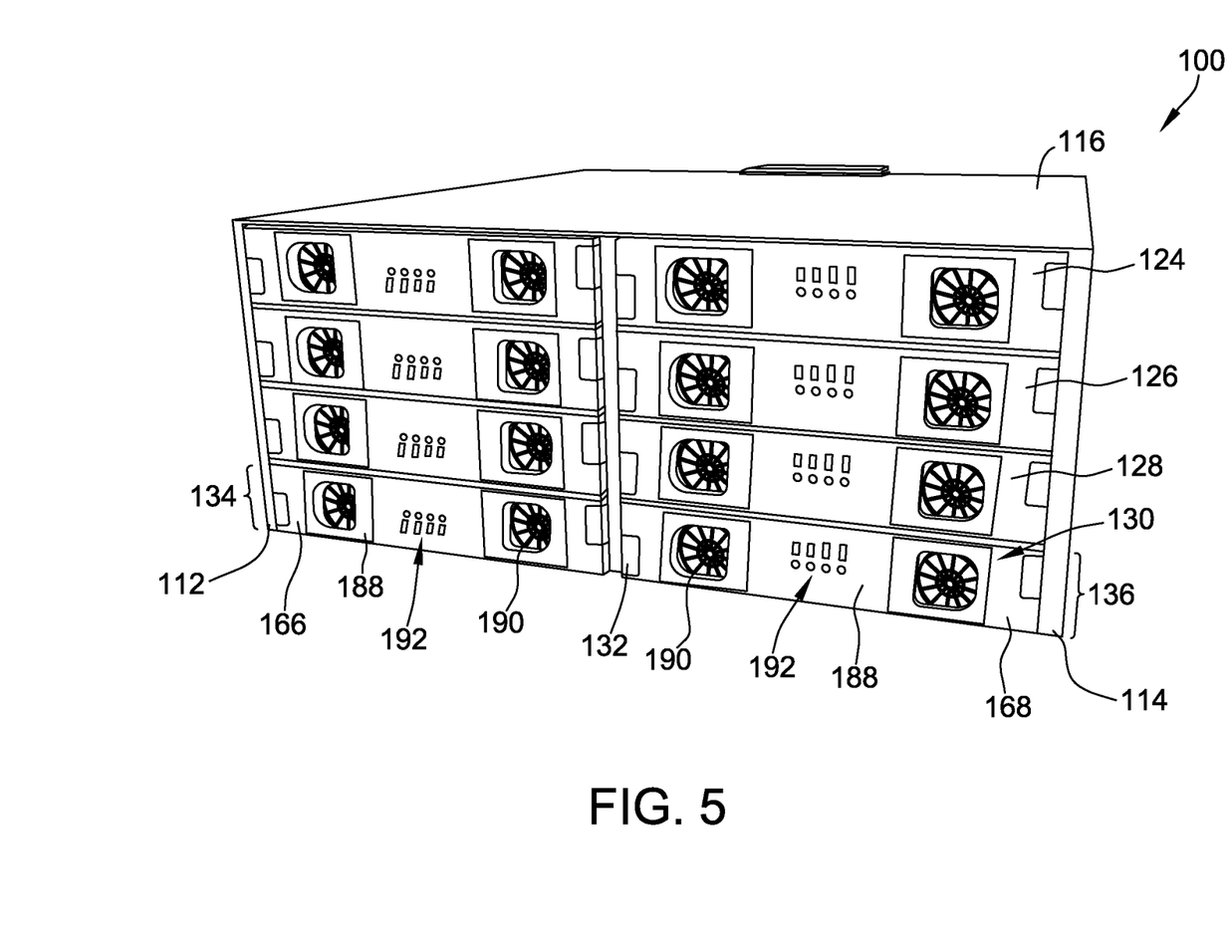
FIG. 5 is a perspective front view of the exemplary power distribution rack fully assembled illustrating a plurality of shelves and adjacent electronics modules inserted therein.

FIG. 3 is a perspective view of partially assembled rack 100 having a plurality of electronics modules 164 inserted therein. The plurality of modules 164 includes a first module 166 inserted into first slot 134 of second shelf 126 and a second module 168 inserted into second slot 136 of second shelf 126. In the exemplary embodiment, modules 166 and 168 are power rectifiers. Alternatively, modules 166 and 168 may be any type of power distribution module, such as, but not limited to, inverters and/or converters. FIG. 4 illustrates a rear perspective view of first module 166 of the plurality of electronics modules 164 for use with power distribution rack 100. FIG. 5 is a front perspective view of fully assembled rack 100 having a module 164 inserted into each adjacent slot 134 and 136 of shelves 124, 126, 128, and 130. More specifically, first module 166 is inserted into first slot 134 of each shelf 124, 126, 128, and 130 and second module 168 is inserted into second slot 136 of each shelf 124, 126, 128, and 130. In the exemplary embodiment, each module 166 and 168 includes a top panel 170, a bottom panel 172, a first side panel 174, a second side panel 176, and a rear panel 178. When inserted into rack 100, top panel 170 of first module 166 is oriented to face top wall 116 and bottom panel 172 of first module 166 is oriented to face bottom wall 118. Similarly, first side panel 174 of first module 166 is oriented to face first side wall 112 and second side panel 176 of first module 166 is oriented to face middle wall 132.

In the exemplary embodiment, first module 166 is substantially similar to module 168 such that modules 166 and 168 are selectively interchangeable within rack 100 to enable insertion of either module 166 and 168 into either of first slot 134 or second slot 136 of any shelf 124, 126, 128, and 130. In such a configuration, second module 168, inserted into second slot 136, is oriented 180 degrees with respect to longitudinal axis 133 such that top panel 170 of second module 168 is oriented to face bottom wall 118 and bottom panel 172 of second module 168 is oriented to face top wall 116. Similarly, first side panel 174 of second module 168 is oriented to face second side wall 114 and second side panel 176 of second module 168 is oriented to face middle wall 132. In the exemplary embodiment, modules 166 and 168 are selectively interchangeable such that first module 166 may be removed from first slot 134, flipped over axis 133, and inserted into second slot 136. Alternatively, first module 166 and second module 168 are not substantially similar and are not selectively interchangeable such that first module 166 is configured to be inserted into only first slot 134 and second module 168 is configured to be inserted into only second slot 136.

In the exemplary embodiment, rear panel 178 of each module 166 and 168 includes at least one AC connector 180 that is configured to engage AC receiver 140 to facilitate inputting AC power into each module 166 and 168 for processing. Alternatively, AC connector 180 may be used to output AC power from modules 166 and 168. AC connector 180 is positioned proximate first side panel 174 such that AC connectors 180 of each first module 166 in first slot 134 are vertically-aligned proximate first side wall 112 and correspond with a respective AC receiver 140 of the first set of AC receivers 141. Similarly, AC connectors 180 of each second module 168 in second slot 136 are vertically-aligned proximate second side wall 114 and are configured to engage a respective AC receiver 140 of the second set of AC receivers 143. In the exemplary embodiment, each AC connector 180 is coupled directly to a respective AC receiver 140 on rack backing 106 such that AC connectors 140 are not coupled to a backplane. Alternatively, AC connectors 180 may be coupled to AC receivers 140 indirectly through a backplane. Generally, AC connectors 180 are coupled to AC receivers 140 in any manner that facilitates operation of power distribution rack 100 as described herein.

Rear panel 178 of each module 166 and 168 also includes a first DC connector 182 and a second DC connector 184 that are each configured to engage a portion of bus bar assembly 102 to facilitate output of DC power from modules 166 and 168 to common DC bus bar assembly 102. Alternatively, DC connectors 182 and 184 may be used to input power from common DC bus bar assembly 102. In the exemplary embodiment, each connector 182 and 184 includes a pair of opposing prongs 186 that clip directly onto a respective flange 148, 150, 156, or 158 of bus bar assembly 102. Directly connecting each module 166 and 168 to common DC bus bar assembly 102 eliminates the need for mating connectors to couple modules 166 and 168 indirectly to a bus bar through a backplane. Such a direct connection reduces production costs and reduces power losses due to power transmission through multiple components as in known power distribution racks. Alternatively, DC connectors 182 and 184 may be any type of connector that facilitates operation of rack 100 as described herein.

First DC connector 182 is positioned proximate second side panel 176 and second DC connector 184 is positioned adjacent first DC connector 182 towards first side panel 174. When modules 166 and 168 are inserted into chassis 104, connectors 182 and 184 of first module 166 in first slot 134 of one of shelves 124, 126, 128, or 130 are vertically aligned with connectors 182 and 184, respectively, of modules 166 in first slot 134 of the other shelves 124, 126, 128, or 130. Similarly, connectors 182 and 184 of second module 168 in second slot 136 of one of shelves 124, 126, 128, or 130 are vertically aligned with connectors 182 and 184, respectively, of modules 168 in second slot 136 of other shelves 124, 126, 128, and 130. More specifically, first DC connector 182 of first module 166 is configured to engage first flange 156 of inner bus bar 144 and second connector 184 of first module 166 is configured to engage first flange 148 of outer bus bar 142. Similarly, first DC connector 182 of second module 168 is configured to engage second flange 158 of inner bus bar 144 and second connector 184 of second module 168 is configured to engage second flange 150 of outer bus bar 142. As described above, outer bus bar 142 and inner bus bar 144 have opposing polarities such that first DC connectors 182 are coupled to inner bus bar 144 having a positive polarity and second DC connectors 184 are coupled to outer bus bar 142 having a negative polarity.

In the exemplary embodiment, centrally located common bus bar assembly 102 and the plurality of flippable modules 164 facilitate orienting DC connectors 182 and 184 of first module 166 in first slots 134 adjacent to DC connectors 182 and 184 of second module 168 in second slots 136. Bus bar assembly 102 and the plurality of flippable modules 164 also facilitate orienting AC connector 180 of first module 166 in first slots 134 proximate first side wall 112 and AC connector 180 of second module 168 in second slots 136 proximate second side wall 114. Orienting DC connectors 182 and 184 of first module 166 adjacent DC connectors 182 and 184 of second module 168 such that modules 166 and 168 are directly coupled to central bus bar assembly 102 facilitates eliminating complex cross-wiring paths and horizontal bus bars required to connect alternating inputs and outputs as is found in known power distribution racks. As described above, at least some known racks include backplanes that alternate DC connectors and AC connectors such that a horizontal bus bar may be required to connect DC connectors of the same shelf and channel DC power to a common bus bar. Such known racks may experience both a power loss and an increase in heat generation at each mechanical joint between the module, the horizontal bus bar, and the common bus bar. By orienting DC connectors 182 and 184 of adjacent modules 166 and 168 adjacent each other, the need for horizontal bus bars is eliminated such that bus bar assembly 102 provides a simpler DC power output path that reduces the amount of mechanical joints within assembly 102 and the power losses and heat generation associated therewith. Moreover, elimination of horizontal bus bars facilitates reducing production and maintenance costs of rack 100 because less copper is required to fabricate bus bar assembly 102 and fewer mechanical joints translates to a reduction in joint failure and associated maintenance costs.

Furthermore, orienting DC connectors 182 and 184 of first module 166 adjacent DC connectors 182 and 184 of second module 168 provides for simpler cabling than the complex cross-cabling paths found in known distribution racks. Such a configuration separates AC connectors 180 and DC connectors 182 and 184 to facilitate minimizing instances of crossing DC equipment, such as connectors 182 and 184 and associated cabling, over AC equipment, such as connectors 180 and associated cabling. Reducing the number of cross-overs and simplifying the cable networking facilitates maximizing usage the limited allowable space within rack 100 to meet industry spacing regulations and also facilitates minimizing the effect of electromagnetic interference between AC equipment and DC equipment, which increases the efficiency and reliability of power distribution rack 100.

As shown in FIG. 5, in the exemplary embodiment, each module 166 and 168 includes a faceplate 188 coupled to at least one of panels 170, 172, 174, and/or 176. Each faceplate 188 includes at least one vent opening 190 and a plurality of status indicators 192. Openings 190 are configured to facilitate channeling cooling air into respective module 166 or 168 from the ambient environment and may also facilitate channeling relatively warmer air from within module 166 or 168 to the environment. Status indicators 192 are configured to indicate the status of respective module 166 or 168 to a user. In the exemplary embodiment, indicators 192 are oriented horizontally in a central region of faceplate 188. Alternatively, indicators 192 may be oriented vertically and positioned proximate middle wall 132 such that a user may more easily view indicators 192 of adjacent modules 166 and 168 in the same shelf 124, 126, 128, or 130.

Figure 6:
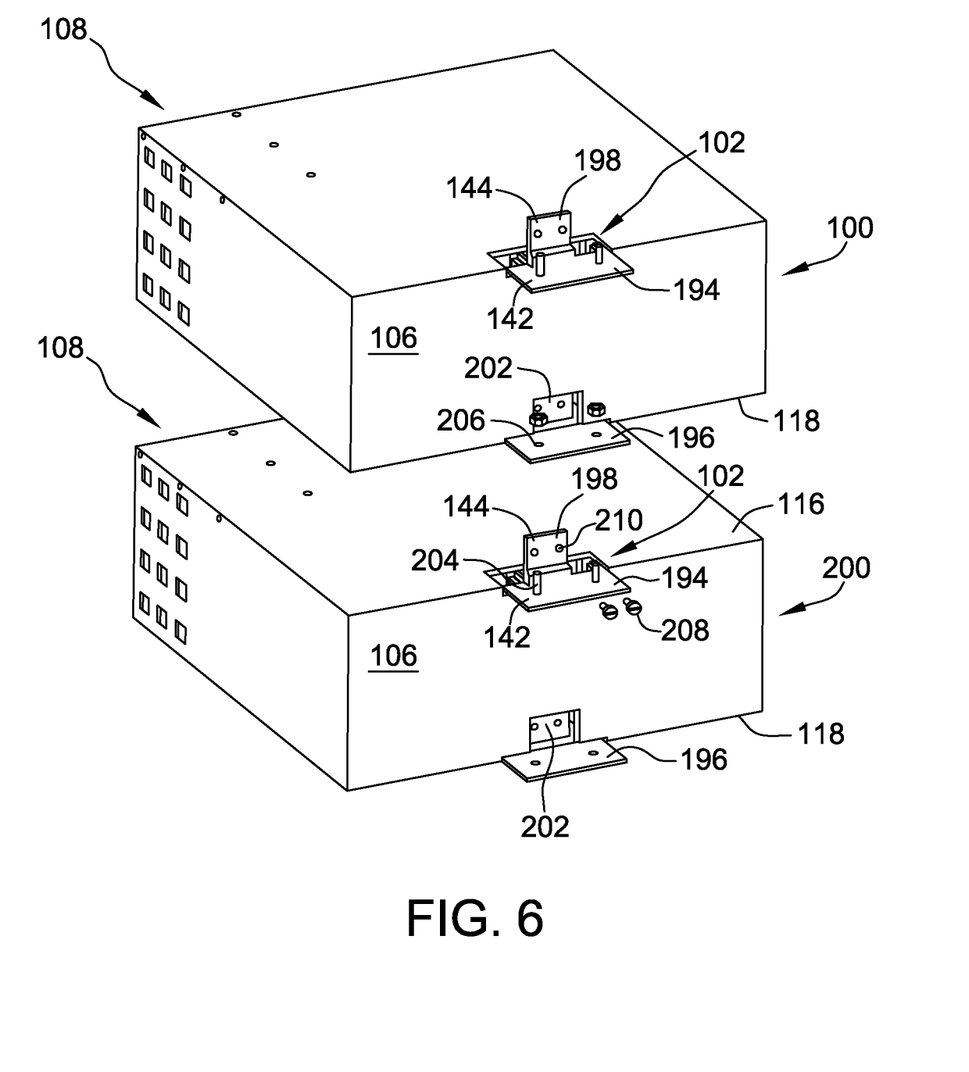
FIG. 6 is a perspective rear exploded view of the exemplary power distribution rack stacked onto a second power distribution rack.

FIG. 6 is a perspective rear exploded view of power distribution rack 100 stacked onto a second power distribution rack 200. Racks 100 and 200 are substantially similar such that identical components are identified with the same reference numerals. Stacking multiple racks 100 facilitates coupling a greater number of modules 164 (shown in FIG. 3) together and creating a higher power system. In the exemplary embodiment, outer bus bar 142 includes a top coupling flange 194 and a bottom coupling flange 196. Similarly, inner bus bar 144 also includes a top coupling flange 198 and a bottom coupling flange 202. Coupling flanges 194, 196, 198, and 202 are configured to facilitate coupling together a plurality of bus bar assemblies 102 to enable stacking of two or more power distribution racks 100 on top of each other. Top and bottom flanges 194 and 196 of outer bus bar 142 are parallel to top and bottom walls 116 and 118 and extend from bus plate 152 (shown in FIG. 1) in a direction opposite front end 108. Top and bottom flanges 198 and 202 of inner bus bar 144 extend from bus plate 160 (shown in FIG. 1) in a direction parallel to rack backing 106. In the exemplary embodiment, outer bus bar top flange 194 of bottom rack 200 is coupled to outer bus bar bottom flange 196 of top rack 100 via threading a fastener 204 through at least one opening 206 in flanges 194 and 196. Similarly, inner bus bar top flange 198 of bottom rack 200 is coupled to inner bus bottom flange 202 of top rack 100 via threading a fastener 208 through at least one opening 210 in flanges 198 and 202. Alternatively, flanges 194 and 196 and flanges 198 and 202 may be coupled using any means that facilitates operation of racks 100 and 200 as described herein.

Exemplary embodiments of a power distribution rack are described herein. The power distribution rack includes a chassis, a plurality of electronics modules that are inserted into adjacent slots of the chassis, and a bus bar assembly coupled to the chassis and to each of the electronics modules. The bus bar assembly is centrally located on the rack and includes an inner bus bar nested within an outer bus bar. Each bus bar is substantially U-shaped and includes first and second flanges such that a first module is coupled to first flanges of the bus bars and an adjacent second module is coupled to the second flanges of the bus bars. More specifically, DC connectors of each module are coupled to the central bus bar assembly such that DC connectors of adjacent modules are adjacent each other to eliminate horizontal bus bars and to facilitate simplifying the cabling network that connects the modules. Both inner and outer bus bars include a plurality of coupling flanges that facilitate stacking one power distribution rack on top of another to create a more powerful system of racks. Additionally, the chassis includes L-shaped rail portions that define the slots and extend a predetermined distance into the rack to support each module while still allowing a flow of cooling air to circulate within the rack.

As compared to at least some known power distribution racks, the power distribution rack and bus bar assembly as described herein eliminates the need for additional components to receive, process, and distribute energy. Directly coupling each module to the central common bus bar assembly eliminates the need for intermediate mating connectors that connect the modules to a backplane and then to a common bus in at least some known power distribution racks. Furthermore, the power distribution rack disclosed herein orients DC connectors of adjacent modules adjacent each other to eliminate the need for horizontal bus bars that cross over AC connectors to connect modules of the same shelf in at least some known power distribution racks. Such a direct connection reduces rack production costs and reduces power losses due to power transmission through multiple components. Moreover, having adjacent DC connectors facilitates eliminating complex cross-wiring paths required to connect alternating AC and DC connectors as is found in at least some known power distribution racks. The power distribution rack described herein simplifies the connection of electronics module inputs and outputs to reduce the production and maintenance costs of the rack and to minimize the EMI between the outputs and inputs to increases the efficiency and reliability of the power distribution rack.

Exemplary embodiments of a power distribution rack bus bar assembly and methods for assembling the same are described above in detail. The methods and assemblies are not limited to the specific embodiments described herein, but rather, components of assemblies and/or steps of the methods may be utilized independently and separately from other components and/or steps described herein. For example, the methods may also be used in combination with other power distribution assemblies, and are not limited to practice with only the power distribution rack and assemblies as described herein. Rather, the exemplary embodiment can be implemented and utilized in connection with many other power distribution applications.

Although specific features of various embodiments of the invention may be shown in some drawings and not in others, this is for convenience only. In accordance with the principles of the invention, any feature of a drawing may be referenced and/or claimed in combination with any feature of any other drawing. Further, although words such as "top" and "bottom" are used throughout the specification, there is no absolute orientation in the universe. For example, when the modules slotted into a chassis on its side, then top and bottom become the sides.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A bus bar assembly for use with a power distribution rack, said bus bar assembly comprising:
   an outer bus bar comprising a first flange, a second flange, and a first bus plate extending therebetween, wherein said first flange, said first bus plate, and said second flange define a first channel, said outer bus bar having a first polarity;
   an inner bus bar coupled within said first channel, said inner bus bar comprising a third flange, a fourth flange, and a second bus plate extending therebetween, wherein said first and third flanges are configured to couple to connectors of a first electronics module and said second and fourth flanges are configured to couple to connectors of a second electronics module, and said inner bus bar having a second polarity different from the first polarity, wherein said first and third flanges define a first space therebetween, and said second and fourth flanges define a second space therebetween, the first space configured to receive the connectors of the first electronics module, the second space configured to receive the connectors of the second electronics module.

2. The bus bar assembly in accordance with claim 1, wherein said power distribution rack includes opposing side walls, and wherein said inner and outer bus bars are oriented substantially mid-way between said side walls.

3. The bus bar assembly in accordance with claim 1 further comprising a plurality of bushings configured to insulate said inner bus bar from said outer bus bar.

4. The bus bar assembly in accordance with claim 1, wherein both of said inner and outer bus bars are substantially U-shaped.

5. The bus bar assembly in accordance with claim 1, wherein said outer bus bar comprises at least one coupling flange extending from said first bus plate, said at least one coupling flange oriented perpendicular to said first bus plate.

6. The bus bar assembly in accordance with claim 1, wherein said inner bus bar includes at least one coupling flange extending from said second bus plate, said at least one coupling flange oriented parallel to said second bus plate.

7. A power distribution rack comprising:
   a chassis defining a first slot and a second slot adjacent said first slot;
   a plurality of electronics modules including a first electronics module coupled within said first slot and a second electronics module coupled within said second slot, wherein said first and said second electronics modules are configured for insertion into respective said first and said second slots, said first electronics module including a first connector and a second connector, said second electronics module including a third connector and a fourth connector;
   a bus bar assembly coupled to said chassis, said bus bar assembly comprising:
      an outer bus bar comprising a first flange, a second flange, and a first channel defined therebetween, said outer bus bar having a first polarity; and
      an inner bus bar coupled within said first channel, said inner bus bar comprising a third flange and a fourth flange, wherein said first and third flanges are coupled to said first electronics module and said second and fourth flanges are coupled to said second electronics module, and said inner bus bar having a second polarity different from the first polarity, wherein said first and third flanges define a first space therebetween, and said second and fourth flanges define a second space therebetween, the first space configured to receive at least a portion of the first and second connectors, the second space configured to receive at least a portion of the third and fourth connectors.

8. The power distribution rack in accordance to claim 7, wherein said first and second electronics modules are substantially similar and are selectively interchangeable between said first slot and said second slot.

9. The power distribution rack in accordance to claim 8 further comprising a longitudinal axis, wherein said second electronics module is oriented 180 degrees with respect to said longitudinal axis from said first electronics module.

10. The power distribution rack in accordance to claim 7, wherein said bus bar assembly includes at least one coupling flange configured to couple said power distribution rack to a second power distribution rack.

11. The power distribution rack in accordance to claim 7 further comprising a plurality of rail portions coupled to said chassis, said rail portions extending a predetermined distance from said chassis to facilitate supporting a respective electronics module of the plurality of electronics modules.

12. The power distribution rack in accordance to claim 7, wherein each module of the plurality of modules includes a faceplate having at least one vent opening and a plurality of status indicators.

13. The power distribution rack in accordance to claim 7 further comprising a rack backing including a plurality of AC receivers, wherein each module of said plurality of electronics modules includes an AC connector configured to couple to a respective one of said plurality of AC receivers.

14. The power distribution rack in accordance to claim 7, wherein said first electronics module includes a first set of output connectors and said second electronics module includes a second set of output connectors, said first set of output connectors positioned adjacent said second set of output connectors.

15. The power distribution rack in accordance to claim 14, wherein said first set of output connectors includes a first output connector coupled to said first flange and a second output connector coupled to said third flange, and wherein said second set of output connectors includes a first output connector coupled to said second flange and a second output connector coupled to said fourth flange.

16. A method of assembling a power distribution rack, said method comprising:
   providing a chassis defining a first slot and a second slot adjacent the first slot;

inserting a first electronics module into the first slot and a second electronics module into the second slot, the first electronics module including a first connector and a second connector, the second electronics module including a third connector and a fourth connector;

coupling a bus bar assembly to the chassis, wherein the bus bar assembly includes:

an outer bus bar comprising a first flange, a second flange, and a first channel defined therebetween, the outer bus bar having a first polarity; and an inner bus bar coupled within the first channel, wherein the inner bus bar includes a third flange and a fourth flange, the inner bus bar having a second polarity different from the first polarity, wherein the first and third flanges define a first space therebetween, and the second and fourth flanges define a second space therebetween; and coupling the first and third flanges to the first electronics module and coupling the second and fourth flanges to the second electronics module, the first and second connectors extending at least partly in the first space, the third and fourth connectors extending at least partly in the second space.

17. The method in accordance with claim 16, wherein inserting a first electronics module into the first slot and a second electronics module into the second slot further comprises orienting the second electronics module 180 degrees with respect to a longitudinal axis from the first electronics module.

18. The method in accordance with claim 16 further comprising coupling a plurality of rail portions to the chassis, wherein each rail portion extends a predetermined distance from the chassis to facilitate supporting a respective electronics module of the plurality of electronics modules.

19. The method in accordance with claim 16 further comprising coupling a rack backing to the chassis, wherein the rack backing includes a plurality of input receivers configured to couple to a respective input connector on each module of the plurality of electronics modules.

* * * * *